(12) United States Patent
Ishibashi et al.

(10) Patent No.: US 7,901,960 B2
(45) Date of Patent: Mar. 8, 2011

(54) GROUP III NITRIDE SUBSTRATE, EPITAXIAL LAYER-PROVIDED SUBSTRATE, METHODS OF MANUFACTURING THE SAME, AND METHOD OF MANUFACTURING SEMICONDUCTOR DEVICE

(75) Inventors: Keiji Ishibashi, Itami (JP); Akihiro Hachigo, Itami (JP); Masato Irikura, Itami (JP); Seiji Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 37 days.

(21) Appl. No.: 12/445,681

(22) PCT Filed: Oct. 9, 2007

(86) PCT No.: PCT/JP2007/069661
§ 371 (c)(1),
(2), (4) Date: Apr. 15, 2009

(87) PCT Pub. No.: WO2008/047627
PCT Pub. Date: Apr. 24, 2008

(65) Prior Publication Data
US 2010/0187540 A1    Jul. 29, 2010

(30) Foreign Application Priority Data
Oct. 19, 2006 (JP) .................................. 2006-284488

(51) Int. Cl.
*H01L 21/00* (2006.01)
(52) U.S. Cl. .............. 438/22; 438/37; 257/97; 257/102; 257/103
(58) Field of Classification Search ...................... 438/22
See application file for complete search history.

(56) References Cited

U.S. PATENT DOCUMENTS
6,518,602 B1 * 2/2003 Yuasa et al. ................... 257/102
(Continued)

FOREIGN PATENT DOCUMENTS

| | | |
|---|---|---|
| EP | 1 612 301 | 1/2006 |
| JP | 11-191544 | 7/1999 |
| JP | 11347920 | 12/1999 |
| JP | 2001-284736 | 10/2001 |
| JP | 2004-083359 | 3/2004 |

(Continued)

OTHER PUBLICATIONS

Varadarajan, E et al. Structural, optical and electrical properties of hig irradiated CI-VPE grown gallium nitride, 2006. Elsevier, Materials Science and Engineering B 129 (2006), pp. 121-125.*

*Primary Examiner* — Ajay K Arora
(74) *Attorney, Agent, or Firm* — Drinker Biddle & Reath LLP (57) ABSTRACT

A group III nitride substrate on which an epitaxially grown layer of good quality can be formed, and a method of manufacturing the same are obtained. A GaN substrate is one of the following: a group III nitride substrate, wherein the number of atoms of an acid material per square centimeter of a surface is not more than $2 \times 10^{14}$, and the number of silicon atoms per square centimeter of the surface is not more than $3 \times 10^{13}$; a group III nitride substrate, wherein the number of silicon atoms per square centimeter of a surface is not more than $3 \times 10^{13}$, and a haze level of the surface is not more than 5 ppm; and a group III nitride substrate, wherein the number of atoms of an acid, material per square centimeter of a surface is not more than $2 \times 10^{14}$, and a haze level of the surface is not more than 5 ppm.

7 Claims, 2 Drawing Sheets

U.S. PATENT DOCUMENTS

| | | |
|---|---|---|
| 2002/0185054 A1 | 12/2002 | Xu et al. |
| 2005/0059229 A1 | 3/2005 | Minemoto et al. |
| 2006/0029832 A1 | 2/2006 | Xu et al. |
| 2007/0018284 A1 | 1/2007 | Nakayama et al. |

FOREIGN PATENT DOCUMENTS

| | | |
|---|---|---|
| JP | 2005-072572 | 3/2005 |
| JP | 2006-60074 | 3/2006 |
| WO | 2005/041283 | 5/2005 |

* cited by examiner

GROUP III NITRIDE SUBSTRATE, EPITAXIAL LAYER-PROVIDED SUBSTRATE, METHODS OF MANUFACTURING THE SAME, AND METHOD OF MANUFACTURING SEMICONDUCTOR DEVICE

TECHNICAL FIELD

The present invention relates to a group III nitride substrate, an epitaxial layer-provided substrate, methods of manufacturing the same, and a method of manufacturing a semiconductor device. More particularly, the present invention relates to a group III nitride substrate on which an epitaxial layer of good film quality can be formed, an epitaxial layer-provided substrate, methods of manufacturing the same, and a method of manufacturing a semiconductor device.

BACKGROUND ART

Conventionally, compound semiconductor substrates including a group III nitride substrate such as a GaN substrate, having a mirror polished surface on which an epitaxially grown layer is formed by epitaxy, have been utilized in various semiconductor devices such as a light emitting device, a power device, and the like. There has been a problem that, if a haze occurs on a surface mirror polished as described above, a defect such as unevenness occurs in an epitaxially grown layer formed thereon, causing deterioration in the quality of the epitaxially grown layer. Therefore, various polishing methods suppressing occurrence of a haze (i.e., reducing a haze level) as described above have conventionally been proposed (for example, as to GaAs, see Patent Document 1 (Japanese Patent Laying-Open No. 11-347920)).
Patent Document 1: Japanese Patent Laying-Open No. 11-347920

DISCLOSURE OF THE INVENTION

Problems to be Solved by the Invention

However, it has been found as a result of the inventors' examination that a mere reduction in the haze level of a surface of a group III nitride substrate such as GaN may cause a defect such as unevenness in an epitaxially grown layer formed on the surface. In this case, it has been difficult to sufficiently reduce the probability of occurrence of a defect in an epitaxially grown layer even by applying a conventional polishing method described above.

The present invention has been made to solve the aforementioned problems, and one object of the present invention is to provide a group III nitride substrate on which an epitaxially grown layer of good quality can be formed, and a method of manufacturing the same.

Another object of the present invention is to provide an epitaxial layer-provided substrate including an epitaxially grown layer of good quality and a method of manufacturing the same, and a method of manufacturing a semiconductor device using the epitaxial layer-provided substrate, utilizing a group III nitride substrate as described above.

Means for Solving the Problems

The inventors have studied the mechanism that causes quality degradation in an epitaxially grown layer formed on a surface of a group III nitride substrate. Specifically, the inventors have performed detailed inspections (such as measurement of the types and number of adhering materials) on a surface of a group III nitride substrate prior to the formation of an epitaxially grown layer thereon, and studied the correlation between the inspection result and the quality of the formed epitaxially grown layer. As a result, the inventors have found that the number of atoms of an acid material and the number of silicon atoms present on a surface of a group III nitride substrate at the time of forming an epitaxially grown layer have a significant influence on the quality of the formed epitaxially grown layer. Herein, the group III nitride substrate refers, for example, to a substrate made of GaN, a substrate made of AlN, and a mixed crystal substrate thereof ($Ga_xAl_yN$). Further, the acid material refers to a material that exhibits acidity when it reacts with water or is dissolved in water, including halogen such as chlorine, fluorine, bromine, iodine, and the like, nitrogen oxide ($NO_x$), sulfur oxide ($SO_x$), hydrogen chloride, and the like.

The inventors have examined the reason that the acid material described above adheres to the surface of the group III nitride substrate, and presumed occurrence of a phenomenon as described below. Specifically, in a step of manufacturing a group III nitride substrate (for example, a GaN substrate), volatile acid materials such as hydrochloric acid and nitric acid are used, and in addition, a polishing solution containing abrasive grains is used to polish the substrate. A chlorine-based oxidizing agent is often used in the polishing solution, and a large amount of chlorine, which is an acid material, is contained in the polishing solution. A polishing step using these acid materials is generally performed with an atmosphere within a polishing apparatus emitted by an emission apparatus. If the emission apparatus cannot emit all the acid material, a portion of the acid material is present in the atmosphere within the polishing apparatus. It is considered that, in this case, the acid material is adsorbed on the surface of the group III nitride substrate. It is also considered that such an acid material reacts with an element constituting the group III nitride substrate to form a deposit on the substrate surface. If such a deposit is formed, values of the surface roughness and the haze level of the substrate surface are increased.

After being polished, the group III nitride substrate is cleaned, and then subjected to a surface inspection. If the acid material is present in large amount on the surface of the group III nitride substrate in the polishing step described above, it is difficult to remove the acid material sufficiently in a later step. Therefore, values of the surface roughness and the haze level of the substrate surface in a final state are increased. Further, the surface inspection is performed within a clean room, and the group III nitride substrate is exposed to an atmosphere within the clean room during the inspection, for at least about one hour. It is also considered that, on this occasion, a minute amount of the acid material flowing from the polishing step described above or the like is adsorbed on the surface of the group III nitride substrate.

Further, when a group III nitride substrate such as a GaN substrate is polished using a polishing solution containing a material containing Si atoms such as $SiO_2$ as abrasive grains, the Si containing material may be left on the substrate surface even though a cleaning step is performed after polishing. The inventors have found that, if the acid material (and/or the deposit) and the Si containing material described above are present to an excessive degree on the surface of the group III nitride substrate, the quality of an epitaxially grown layer formed on the substrate surface is deteriorated. That is, in order to form a high-quality epitaxially grown layer on the surface of the group III nitride substrate, it is effective to reduce concentrations of the acid material and the Si containing material described above on the substrate surface. The inventors have then found that, in order to reduce the concentration of the acid material on the substrate surface as described above, it is effective to reduce the concentration of the acid material in an ambient gas in contact with the substrate surface within a polishing apparatus, as much as possible. Further, the inventors have found that, in order to reduce the concentration of the Si containing material (or silicon atoms) adhering to the substrate surface, it is effective that a polishing solution used in the polishing step contains an acid and a surface-active agent. It is to be noted that the problem that the concentration of the acid material on the substrate surface is increased when the concentration of the acid material within an atmosphere in the manufacturing step is high occurs not only in the polishing step and the inspection step, but also in other steps.

In a group III nitride substrate according to the present invention made by the findings described above, a number of atoms of an acid material per square centimeter of a surface is not more than $2 \times 10^{14}$, and a number of silicon (Si) atoms per square centimeter of the surface is not more than $3 \times 10^{13}$.

With this construction, an epitaxially grown layer of good quality can be formed on the surface of the group III nitride substrate. It is to be noted that the reason for setting the number of atoms of the acid material per square centimeter of the surface of the group III nitride substrate to not more than $2 \times 10^{14}$ is that, if the number of atoms of the acid material is suppressed to not more than this degree, the roughness and the haze level of the substrate surface can be reduced sufficiently (i.e., the degree of unevenness of the substrate surface can be reduced sufficiently). Further, the reason for setting the number of silicon (Si) atoms per square centimeter of the surface to not more than $3 \times 10^{13}$ is that, with this setting, the quality of the formed epitaxially grown layer (for example, the surface roughness and the film quality of the epitaxially grown layer) can be maintained sufficiently good (for example, a prescribed light emission intensity can be obtained when the epitaxially grown layer is utilized as a light emission layer of a light emitting device). It is to be noted that, if the acid material is present as a simple substance such as halogen including fluorine, chlorine, bromine, iodine, and the like, the number of atoms of the acid material refers to the number of halogen atoms, and if the acid material is present as a compound such as nitrogen oxide ($NO_x$), sulfur oxide ($SO_x$), or the like, the number of atoms of the acid material refers to the number of molecules of the compound. Further, if silicon is present as a simple substance, the number of silicon atoms refers to the number of atoms of the silicon, and if silicon is present as a compound such as $SiO_2$, the number of silicon atoms refers to the number of molecules of the compound.

In the group III nitride substrate described above, the haze level of the surface may be not more than 5 ppm. This is because the surface roughness of the group III nitride substrate can be reduced sufficiently by setting the number of atoms of the acid material (the density of the acid material) per square centimeter of the surface of the substrate to not more than the value as described above, and thus the degree of haze (haze level) can also be reduced sufficiently. By reducing the haze level of the substrate surface as described above, quality deterioration of the epitaxially grown layer formed on the substrate surface can be prevented. It is to be noted that the reason for setting the upper limit of the haze level to 5 ppm is that, if the haze level is more than 5 ppm, the quality of the formed epitaxially grown layer is deteriorated, and sufficient light emission intensity cannot be obtained when the epitaxially grown layer is utilized for example as a light emission layer of a light emitting device.

In a group III nitride substrate according to the present invention, a number of silicon atoms per square centimeter of a surface is not more than $3 \times 10^{13}$, and a haze level of the surface is not more than 5 ppm. Further, in a group III nitride substrate according to the present invention, a number of atoms of an acid material per square centimeter of a surface is not more than $2 \times 10^{14}$, and a haze level of the surface is not more than 5 ppm.

With this construction, an epitaxially grown layer of good quality can be formed on the surface of the group III nitride substrate.

In the group III nitride substrate described above, the number of atoms of the acid material per square centimeter of the surface is preferably not more than $9 \times 10^{13}$. Further, in the group III nitride substrate described above, the haze level of the surface is preferably not more than 3 ppm. Furthermore, in the group III nitride substrate described above, the number of silicon atoms per square centimeter of the surface is preferably not more than $1 \times 10^{13}$.

In this case, the film quality of the epitaxially grown layer formed on the surface of the group III nitride substrate can be further improved. For example, when the substrate is used to form a light emitting device and the epitaxially grown layer is used to form a light emission layer, light emission intensity of the light emission layer can be further increased.

An epitaxial layer-provided substrate according to the present invention includes a base substrate made of a group III nitride, and an epitaxially grown layer formed on a surface of the base substrate. A number of silicon (Si) atoms per cubic centimeter at an interface between the base substrate and the epitaxially grown layer is not more than $1 \times 10^{20}$.

In the epitaxial layer-provided substrate constructed as described above, the epitaxially grown layer is formed with the number of silicon atoms on the surface of the base substrate maintained low, and thus the epitaxially grown layer can be formed to have good film quality. Therefore, occurrence of a problem that, when the epitaxial layer-provided substrate described above is used to form a semiconductor device (for example, a light emitting device), the semiconductor device does not offer sufficient performance (i.e., becomes defective) due to poor quality of the epitaxially grown layer can be suppressed. Herein, an epitaxial layer-provided substrate refers to a substrate having at least one layer formed by epitaxy (epitaxially grown layer) formed on a surface of a base substrate. Further, in the epitaxial layer-provided substrate described above, the number of silicon (Si) atoms per cubic centimeter at the interface between the base substrate and the epitaxially grown layer may be not more than $1 \times 10^{19}$. In this case, the epitaxially grown layer can be formed to have more excellent quality. The number of silicon atoms per cubic centimeter at the interface is preferably not more than $1 \times 10^{18}$, and more preferably not more than $1 \times 10^{17}$.

In the group III nitride substrate described above, a surface roughness in Ra may be not more than 1 nm. In the epitaxial layer-provided substrate described above, a surface roughness in Ra of a surface of the epitaxially grown layer may be not more than 1 nm. Further, an affected layer formed on the surface of the group III nitride substrate described above may have a thickness of not more than 50 nm. An affected layer formed on the surface of the base substrate of the epitaxial layer-provided substrate described above may have a thickness of not more than 50 nm. Herein, the thickness of the affected layer described above can be evaluated by observing the substrate using a transmission electron microscope (TEM), defining an area in which crystal lattice distortion occurs as the affected layer, and measuring the thickness of the area having distortion (affected layer).

A method of manufacturing a group III nitride substrate according to the present invention includes a polishing step of polishing a surface of the group III nitride substrate, and a cleaning step of cleaning the surface of the group III nitride substrate after the polishing step. An ambient gas in contact with the group III nitride substrate is controlled during the polishing step and after the cleaning step to maintain a number of atoms of an acid material per square centimeter of the surface of the group III nitride substrate after the cleaning step to be not more than $2\times10^{14}$. In the polishing step, the surface of the group III nitride substrate is polished by chemical mechanical polishing. A polishing solution used in the chemical mechanical polishing contains a surface-active agent and an acid.

With this method, by controlling the ambient gas described above (for example, by operating an emission mechanism to allow the ambient gas containing the acid material to be quickly removed from around the group III nitride substrate, or by disposing an adsorbing agent for adsorbing the acid material in a flow path of the ambient gas to allow the concentration of the acid material contained in the ambient gas to be lower than a prescribed value), the possibility that the acid material adheres from the ambient gas to the surface of the group III nitride substrate during the polishing step and after the cleaning step can be reduced. Further, by using the polishing solution as described above in the polishing step, the possibility that foreign matter (an Si containing material) such as abrasive grains (a granular material) made of $SiO_2$ or the like in the polishing solution adheres to the surface of the group III nitride substrate after the polishing step can be reduced. Therefore, the density of the Si containing material, that is, silicon atoms, on the surface of the group III nitride substrate can be reduced.

In the method of manufacturing a group III nitride substrate described above, the polishing solution may further contain an oxidizing agent. In this case, a polishing rate in the polishing step can be improved. Therefore, efficiency of manufacturing the group III nitride substrate can be improved.

In the method of manufacturing a group III nitride substrate described above, the acid contained in the polishing solution is not particularly limited, and an inorganic acid such as hydrochloric acid, hydrofluoric acid, boronic acid, iodic acid, nitric acid, sulfuric acid, phosphoric acid, carbonic acid, or the like, as well as an organic acid such as formic acid, acetic acid, citric acid, malic acid, tartaric acid, succinic acid, phthalic acid, fumaric acid, oxalic acid, or the like can be used, for example. In the method of manufacturing a group III nitride substrate described above, the organic acid may be a carboxylic acid having a valence of not less than 2. In this case, a polishing rate in the polishing step can be improved, and the possibility that foreign matter adheres to the surface of the substrate due to the acid contained in the polishing solution can be reduced. Herein, the organic acid refers to an organic compound exhibiting acidity. The surface-active agent contained in the polishing solution is not particularly limited, and any of cationic, anionic, and nonionic surface-active agents may be used.

The method of manufacturing a group III nitride substrate described above may further include, after the polishing step and before the cleaning step, a step of polishing the surface of the group III nitride substrate using an acid solution or an alkaline solution. In the step of polishing, both a step of polishing the surface of the group III nitride substrate using an acid solution and a step of polishing the surface of the group III nitride substrate using an alkaline solution may be performed in order, or a step of polishing the surface of the group III nitride substrate using an acid solution and/or a step of polishing the surface of the group III nitride substrate using an alkaline solution may be repeated a plurality of times. The alkaline solution is not particularly limited, and a base such as KOH, NaOH, $NH_4OH$, amine, or the like can be used. In this case, since foreign matter can be removed from the surface of the group III nitride substrate prior to the cleaning step by the polishing, the probability of occurrence of a problem that foreign matter (for example, an Si-containing material) remains on the substrate surface after the cleaning step can be reduced.

The surface of the substrate can be removed and finished by dry etching instead of chemical mechanical polishing. Dry etching refers to any of the methods of removing a surface of a group III nitride substrate as a solid by utilizing a chemical or physical reaction at an interface between a vapor phase and a solid phase caused by gas, plasma, ion, light, or the like, without using a liquid.

A chlorine-based gas is often used to dry etch a group III nitride substrate, and chlorine as an acid material may be left and present on the substrate surface. Examples of the chlorine-based gas include $Cl_2$, $BCl_3$, $SiCl_4$, and the like. As the gas used for dry etching, a mixed gas containing any of these chlorine-based gases and an inert gas such as Ar or $N_2$ can also be employed. The acid material on the substrate surface can be reduced by adjusting conditions such as the dilution, the pressure, the flow rate, and the like of the inert gas. Further, to smooth the surface of the group III nitride substrate by dry etching, it is effective that Si is present in plasma. Si can be added to plasma using gas such as $SiCl_4$, or Si can be present in plasma by disposing an Si compound in the vicinity of the substrate and etching the Si compound simultaneously with the substrate. There may be a case where, since Si is present in an etching atmosphere, Si remains on the substrate surface subjected to dry etching. In this case, silicon on the substrate surface can be reduced by controlling the concentration of Si in plasma.

Further, in a method of manufacturing a group III nitride substrate according to the present invention, a surface of the group III nitride substrate is dry etched within an atmosphere containing Si using a chlorine-based gas, and thereby a number of atoms of an acid material per square centimeter of the surface is not more than $2\times10^{14}$, and a number of silicon atoms per square centimeter of the surface is not more than $3\times10^{13}$. Herein, the chlorine-based gas refers to a gas containing chlorine in the composition of constituents thereof, and may be, for example, a chlorine gas or a gas containing chlorine in the composition thereof, or a mixed gas containing at least one type of these gases.

A method of manufacturing an epitaxial layer-provided substrate according to the present invention includes a substrate preparation step of performing the method of manufacturing a group III nitride substrate described above, and a step of forming an epitaxially grown layer on a surface of the group III nitride substrate obtained by the substrate preparation step. With this method, an epitaxially grown layer of good quality can be formed on the surface of the group III nitride substrate.

A method of manufacturing an epitaxial layer-provided substrate according to the present invention includes a substrate preparation step of preparing the group III nitride substrate described above, and a step of forming an epitaxially grown layer on a surface of the group III nitride substrate prepared by the substrate preparation step. With this method, an epitaxially grown layer of good quality can be formed on the surface of the group III nitride substrate.

A method of manufacturing a semiconductor device according to the present invention includes an epitaxial layer-provided substrate preparation step of performing the method of manufacturing an epitaxial layer-provided substrate described above, and a step of forming the semiconductor device by performing an electrode formation step and a processing step on the epitaxial layer-provided substrate obtained by the epitaxial layer-provided substrate preparation step. With this method, a semiconductor device can be formed using an epitaxial layer-provided substrate having an epitaxially grown layer of excellent quality, and thus the probability of occurrence of failure in the semiconductor device due to poor quality of the epitaxially grown layer can be reduced. Therefore, a reduction in the yield of the semiconductor device can be suppressed.

Effects of the Invention

As described above, according to the present invention, an epitaxial layer-provided substrate having an epitaxially grown layer of excellent quality formed on a surface of a group III nitride substrate can be obtained. Therefore, the probability of occurrence of failure in a semiconductor device can be reduced by forming the semiconductor device using the epitaxial layer-provided substrate.

DESCRIPTION OF THE REFERENCE SIGNS

1: substrate, 3: surface, 5: epitaxially grown layer, 10: epitaxial layer-provided substrate.

BEST MODES FOR CARRYING OUT THE INVENTION

Hereinafter, embodiments and examples of the present invention will be described with reference to the drawings, in which identical or corresponding parts will be designated by the same reference numerals, and the description thereof will not be repeated.

Figure 1:
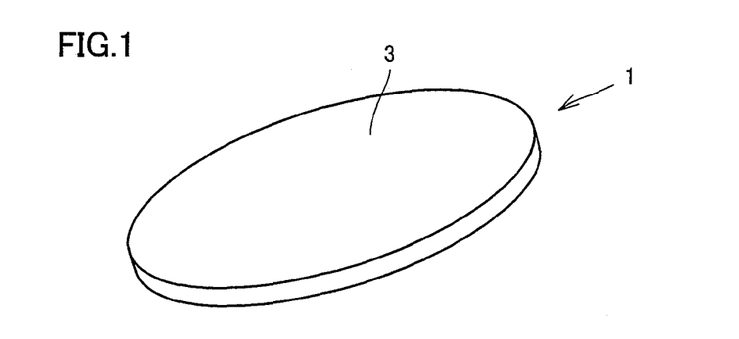
FIG. 1 is a schematic perspective view showing a GaN substrate as an example of a group III nitride substrate according to the present invention.
Figure 2:
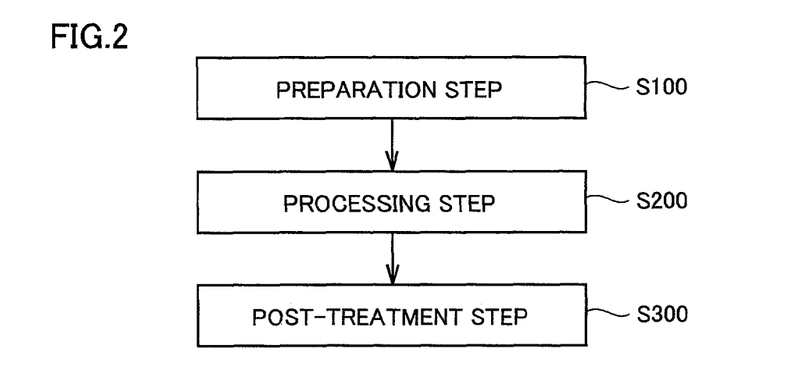
FIG. 2 is a flowchart for illustrating a method of manufacturing a semiconductor device using the GaN substrate shown in FIG. 1.
Figure 3:
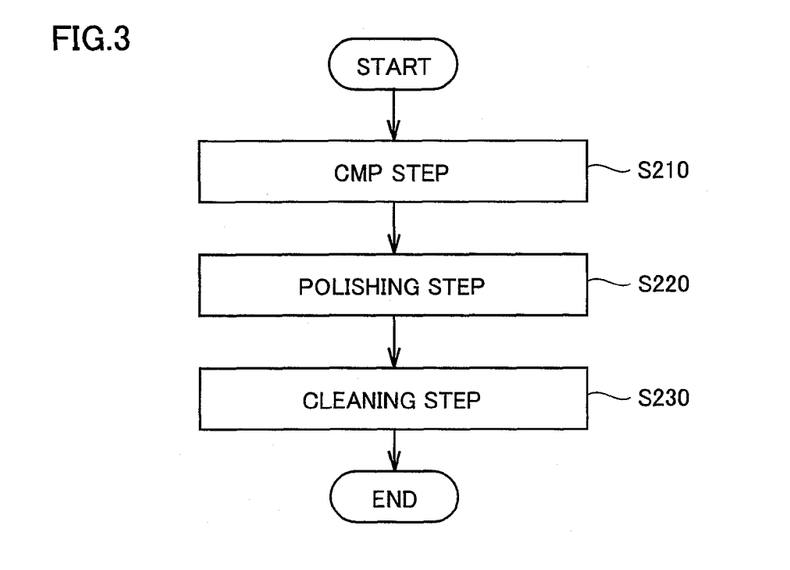
FIG. 3 is a flowchart for illustrating details of a processing step shown in FIG. 2.
Figure 4:
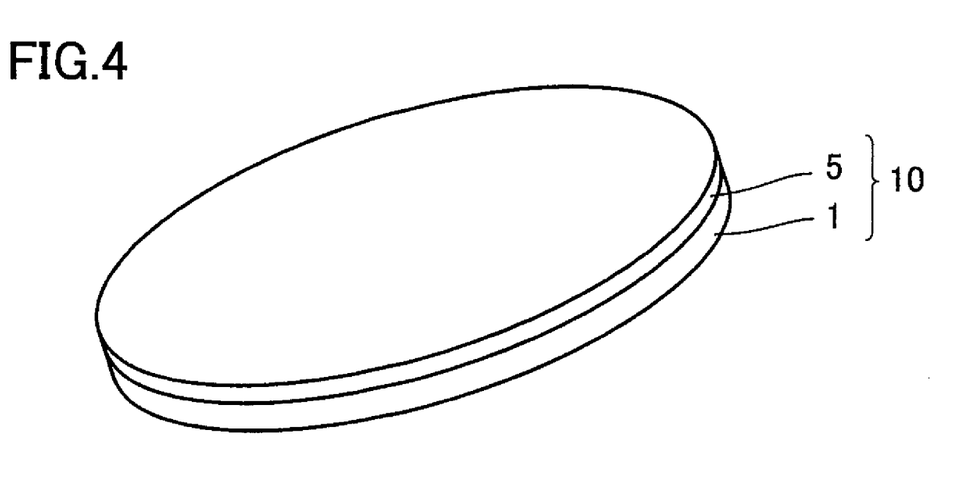
FIG. 4 is a schematic perspective view showing an epitaxial layer-provided substrate using the GaN substrate shown in FIG. 1.

FIG. 1 is a schematic perspective view showing a GaN substrate as an example of a group III nitride substrate according to the present invention. FIG. 2 is a flowchart for illustrating a method of manufacturing a semiconductor device using the GaN substrate shown in FIG. 1. FIG. 3 is a flowchart for illustrating details of a processing step shown in FIG. 2. FIG. 4 is a schematic perspective view showing an epitaxial layer-provided substrate using the GaN substrate shown in FIG. 1. Referring to FIGS. 1 to 4, embodiments of a GaN substrate, an epitaxial layer-provided substrate, and a method of manufacturing a semiconductor device according to the present invention will be described.

As shown in FIG. 1, in a GaN substrate 1 according to the present invention subjected to a treatment step described later, the number of atoms of an acid material (for example, chlorine atoms) per square centimeter of a surface thereof (for example, after polishing and cleaning) is not more than $2\times10^{14}$, and the number of silicon atoms per square centimeter of the surface is not more than $3\times10^{13}$. Further, in GaN substrate 1, a haze level of the surface is not more than 5 ppm. With this constitution, an epitaxially grown layer of good quality can be formed on a surface of a group III nitride substrate.

In GaN substrate 1 described above, the number of atoms of the acid material per square centimeter of a surface 3 is preferably not more than $9\times10^{13}$. Further, in GaN substrate 1 described above, the haze level of surface 3 is preferably not more than 3 ppm. Furthermore, in GaN substrate 1 described above, the number of silicon atoms per square centimeter of surface 3 is preferably not more than $1\times10^{13}$.

In this case, the film quality of an epitaxially grown layer 5 (see FIG. 4) formed on surface 3 of GaN substrate 1 can be further improved. For example, when GaN substrate 1 is used to form a light emitting device and the epitaxially grown layer is used to form a light emission layer as described later, light emission intensity of the light emission layer can be further increased.

It is to be noted that the number of atoms of the acid material and the number of silicon atoms described above were measured using a TXRF (Total X-ray Reflection Fluorescence) instrument, and the haze level was measured using SURFSCAN 4500 manufactured by Tencor.

Next, referring to FIGS. 2 and 3, a method of manufacturing a semiconductor device including a step of manufacturing the GaN substrate shown in FIG. 1 will be described.

As shown in FIG. 2, a preparation step (S100) as a step of preparing the GaN substrate is firstly performed. In the preparation step (S100), the GaN substrate can be prepared using any conventionally known method.

Then, a processing step (S200) performing polishing and the like on the GaN substrate is performed. Referring to FIG. 3, treatment details of the processing step (S200) will be described. As shown in FIG. 3, in the processing step (S200), a CMP step (S210) as a polishing step is firstly performed. In the CMP step (S210), the surface of the GaN substrate prepared in the preparation step (S100) is polished by CMP (chemical mechanical polishing). As a result, the surface of the GaN substrate is mirror finished.

On this occasion, not only abrasive grains but also a surface-active agent and an acid are added to a polishing solution used in the CMP step (S210). As the abrasive grains contained in the polishing solution, $SiO_2$, $Al_2O_3$, $ZrO_2$, $CeO_2$, $Fe_2O_3$, $Cr_2O_3$, or the like can be used, for example. To improve cleaning performance, it is preferable to use a metal element having a high ionization tendency as a metal element constituting the abrasive grains. For example, if abrasive grains containing a metal element having an ionization tendency higher than that of hydrogen (H) is used, the efficiency of removing abrasive grains and the like in a cleaning step described later is increased. As the acid, hydrochloric acid or the like may be used, and an organic acid such as malic acid, citric acid, or the like can also be used. Preferably, a carboxylic acid having a valence of not less than 2 is used as the organic acid. In addition, an oxidizing agent may be further added to the polishing solution. Examples of the oxidizing agent used preferably include hypochlorous acid and hypochlorite, chlorinated isocyanuric acid such as trichloroisocyanuric acid (TCIA), chlorinated isocyanurate such as sodium dichloroisocyanurate, permanganate such as potassium permanganate, dichromate such as potassium dichromate, bromate such as potassium bromate, thiosulfate such as sodium thiosulfate, persulfate such as ammonium persulfate and potassium persulfate, nitric acid, aqueous hydrogen peroxide, ozone, and the like.

Next, a polishing step (S220) is performed. In the polishing step, an acid or alkaline polishing solution is used. As the acid polishing solution, for example, hydrochloric acid, nitric acid, phosphoric acid, citric acid, malic acid, or the like can be used. As the alkaline polishing solution, for example, potassium hydroxide, sodium hydroxide, sodium carbonate, or the like can be used.

Then, a cleaning step (S230) is performed. In the cleaning step (S230), any cleaning method can be utilized. For example, pure water cleaning using pure water may be performed as the cleaning step (S230). At least during the CMP step (S210), during the polishing step (S220), and in a step after the cleaning step (S230), an ambient gas in contact with the GaN substrate (i.e., an ambient gas within a clean room in which the GaN substrate is treated) is emitted from around the GaN substrate to allow the concentration of an acid material, in particular chlorine atoms, to be maintained low, and an adsorbing agent adsorbing the acid material is disposed in a circulation system of the ambient gas. As the adsorbing agent, for example, activated carbon is used. In this manner, the concentration of an acid material, in particular chlorine atoms, within the ambient gas is maintained at not more than a prescribed value (for example, not more than 0.02 ppm). As a result, the number of atoms of chlorine as an acid material adhering to the surface of the GaN substrate after polishing and cleaning can be reduced. It is to be noted that, also during the polishing step (S220), an ambient gas in contact with the GaN substrate may be emitted from around the GaN substrate as described above, and an adsorbing agent adsorbing the acid material may be disposed in a circulation system of the ambient gas.

By performing the steps as described above, GaN substrate 1 as shown in FIG. 1 having sufficiently small densities of atoms of an acid material and silicon on the surface thereof can be obtained. It is to be noted that, in the processing step (S200), the surface of the GaN substrate can be treated by a dry etching step instead of the CMP step. The dry etching step can also be performed in addition to the CMP step.

Next, as shown in FIG. 2, a post-treatment step (S300) is performed on the GaN substrate mirror finished by the processing step (S200). In the post-treatment step (S300), for example, a step of forming a prescribed epitaxially grown layer on the surface of the GaN substrate (a film forming step) is performed. As a result of the film forming step, an epitaxial layer-provided substrate 10 having an epitaxially grown layer 5 formed on the surface of GaN substrate 1 as shown in FIG. 4 can be obtained. Further, in the post-treatment step (S300), an assembly step of assembling a device such as a light emitting device is implemented by performing a step of forming an electrode on a surface of epitaxial layer-provided substrate 10 (an electrode forming step), a separation step of separating epitaxial layer-provided substrate 10 into individual devices, and a step of connecting the formed device to a frame (a processing step).

Embodiments of the present invention will be enumerated and described, although they partly overlap with the embodiment described above. A method of manufacturing a group III nitride substrate (GaN substrate 1) according to the present invention includes a polishing step (CMP step (S210)) of polishing a surface of GaN substrate 1, and a cleaning step (S230) of cleaning the surface of GaN substrate 1 after the CMP step (S210). An ambient gas in contact with GaN substrate 1 is controlled during the polishing step (CMP step (S210)) and after the cleaning step (S230) to maintain the number of atoms of an acid material per square centimeter of the surface of GaN substrate 1 after the cleaning step (S230) to be not more than $2\times10^{14}$. Specifically, an adsorption member adsorbing the acid material, such as activated carbon, is disposed within the ambient gas to maintain the concentration of the acid material within the ambient gas to be not more than a prescribed value. Further, during the CMP step (S210) and after the cleaning step (S230) described above, an emission mechanism may be provided to maintain the concentration of the acid material within the ambient gas to be not more than a prescribed value. In the CMP step (S210), the surface of GaN substrate 1 is polished by chemical mechanical polishing. A polishing solution used in the chemical mechanical polishing contains a surface-active agent and an acid.

With this method, the ambient gas described above is controlled such that the acid material is removed from the ambient gas, and thus the possibility that the acid material adheres from the ambient gas to the surface of GaN substrate 1 during the CMP step and after the cleaning step can be reduced. Further, by using the polishing solution as described above in the CMP step (S210), the possibility that an Si containing material in the polishing solution adheres to the surface of GaN substrate 1 after the CMP step (S210) can be reduced. Therefore, the density of the Si containing material, that is, silicon atoms, on the surface of GaN substrate 1 can be reduced.

In the CMP step (S210) described above, the polishing solution may further contain an oxidizing agent. In this case, a polishing rate in the polishing step can be improved.

Further, the acid contained in the polishing solution may be an organic acid. Furthermore, the organic acid may be a carboxylic acid having a valence of not less than 2. In this case, a polishing rate in the polishing step can be improved, and the possibility that foreign matter adheres to the surface of the substrate due to the acid contained in the polishing solution can be reduced.

The method of manufacturing a GaN substrate described above may further include, after the CMP step (S210) and before the cleaning step (S230), a step of polishing the surface of GaN substrate 1 using an acid solution or an alkaline solution (the polishing step (S220)). In the polishing step (S220), both a step of polishing the surface of GaN substrate 1 using an acid solution and a step of polishing the surface of GaN substrate 1 using an alkaline solution may be performed in order, or a step of polishing the surface of GaN substrate 1 using an acid solution and/or a step of polishing the surface of GaN substrate 1 using an alkaline solution may be repeated a plurality of times. In this case, since foreign matter can be removed from the surface of GaN substrate 1 prior to the cleaning step by the polishing, the probability of occurrence of a problem that foreign matter remains on the surface of GaN substrate 1 after the cleaning step (S230) can be reduced. Further, since the acid material can also be reduced prior to the cleaning step by the polishing step, the existing amount thereof after the cleaning step can be reduced.

Further, dry etching can be performed instead of the CMP step. Examples of the dry etching include RIE (Reactive Ion Etching), ICP (Inductively Coupled Plasma)-RIE, ECR (Electron Cyclotron Resonance)-RIE, CAIBE (Chemical Assist Ion Beam Etching), RIBE (Reactive Ion Beam Etching), and the like.

A method of manufacturing an epitaxial layer-provided substrate according to the present invention includes a substrate preparation step (the processing step (S200) in FIG. 2) of performing the method of manufacturing a GaN substrate described above (or preparing GaN substrate 1 as the group III nitride substrate described above), and a step of forming an epitaxially grown layer (the film forming step included in the post-treatment step (S300)) on a surface of the group III nitride substrate obtained by the processing step (S200). With this method, epitaxially grown layer 5 of good quality can be formed on surface 3 of GaN substrate 1.

A method of manufacturing a semiconductor device according to the present invention includes an epitaxial layer-provided substrate preparation step (the processing step (S200) and the film forming step) of performing the method of manufacturing an epitaxial layer-provided substrate described above, and a step of forming the semiconductor device (steps after the film forming step in the post-treatment step (S300)) by performing an electrode formation step and a processing step (included in the post-treatment step (S300)) on epitaxial layer-provided substrate 10 obtained by the epitaxial layer-provided substrate preparation step. With this method, the semiconductor device can be formed using epitaxial layer-provided substrate 10 having epitaxially grown layer 5 of excellent quality, and thus the probability of occurrence of failure in the semiconductor device due to poor quality of epitaxially grown layer 5 can be reduced.

Further, epitaxial layer-provided substrate 10 according to the present invention includes GaN substrate 1 as a base substrate made of a group III nitride, and epitaxially grown layer 5 formed on surface 3 of GaN substrate 1, as shown in FIG. 4. The number of silicon (Si) atoms per cubic centimeter at an interface between GaN substrate 1 and epitaxially grown layer 5 is not more than $1 \times 10^{20}$. Furthermore, epitaxial layer-provided substrate 10 according to the present invention includes GaN substrate 1 as the group III nitride substrate according to the present invention described above, and an epitaxially grown layer formed on a surface of GaN substrate 1.

In epitaxial layer-provided substrate 10 constructed as described above, epitaxially grown layer 5 is formed with the number of silicon atoms on the surface of GaN substrate 1 maintained low, and thus epitaxially grown layer 5 can be formed to have good quality. Therefore, occurrence of a problem that, when epitaxial layer-provided substrate 10 described above is used to form, for example, a light emitting device, the device becomes defective due to poor quality of epitaxially grown layer 5 can be suppressed.

Further, in the epitaxial layer-provided substrate described above, the number of silicon (Si) atoms per cubic centimeter at the interface between GaN substrate 1 and epitaxially grown layer 5 may be not more than $1 \times 10^{19}$. In this case, epitaxially grown layer 5 can be formed to have more excellent quality. The number of silicon (Si) atoms per cubic centimeter at the interface between GaN substrate 1 and epitaxially grown layer 5 (the density of Si atoms) can be measured by SIMS (Secondary Ion Mass Spectrometry). For example, measurement can be performed using a magnetic sector SIMS instrument manufactured by CAMECA as a measuring instrument, and under a measurement condition that $Cs^+$ is used as a primary ion.

EXAMPLE 1

To confirm the effect of the present invention, experiments as described below were conducted.
(Preparation of Samples)
Samples of examples 1 to 13 were prepared as samples of the examples of the present invention, and samples of comparative examples 1 to 4 were prepared as comparative examples. Specifically, GaN substrates to serve as examples 1 to 13 and comparative examples 1 to 4 were prepared. The GaN substrates were all in the shape of a disk with a diameter of 50 mm and a thickness of 0.5 mm. For these GaN substrates, lapping was performed beforehand on a surface thereof, using diamond abrasive grains. As the abrasive grains used for the lapping, abrasive grains with an average diameter of 6 μm, 2 μm, and 0.5 μm were prepared respectively, and the lapping was performed, firstly using the abrasive grains with a larger diameter, and then using the abrasive grains with a smaller diameter, in a step-by-step manner. After the lapping, polishing was performed using alumina abrasive grains. As the alumina abrasive grains, those with an average diameter of 0.5 μm were used. In this manner, the surfaces of the samples of the GaN substrates were pretreated.
(Polishing of Samples)

Processing as described below was performed on the GaN substrates prepared as described above, within a clean room. It is to be noted that, to maintain the concentration of an acid material, in particular chlorine atoms, sufficiently low in an ambient gas within a polishing apparatus installed in the clean room, the ambient gas was able to be emitted from the inside of a treatment chamber in which the GaN substrates were disposed. The ambient gas was emitted at an emission wind speed of 0.6 m/s. In the polishing apparatus, the surfaces of the GaN substrates to serve as examples 1 to 8 and 11 to 13 were polished by CMP. As shown in Table 1, polishing solutions used for the polishing for examples 1 to 8 contained $SiO_2$ as abrasive grains. Polishing solutions used for the polishing for examples 11 to 13 contained $ZrO_2$, $Cr_2O_3$, $Fe_2O_3$, respectively, as abrasive grains. The polishing solutions contained hydrochloric acid, malic acid, or citric acid, as an acid for adjusting pH. With these acids added thereto, the polishing solutions had pHs of around not less than 2 and not more than 4. Further, 0.05 percent by mass of sodium polyacrylate was added as a surface-active agent to the polishing solutions. Furthermore, as an oxidizing agent, 0.1 percent by mass of trichloroisocyanuric acid (TCIA) was added to the polishing solutions used in examples 2, 5, 6, and 10 to 13, hypochlorous acid was added in examples 1 and 7, and sodium dichloroisocyanurate (Na-DCIA) was added in example 3. In examples 4 and 8, polishing solutions not containing an oxidizing agent were used. After the polishing step, pure water cleaning was performed to obtain the GaN substrates having a mirror-finished surface. For each of these GaN substrates, concentrations of Si and chlorine on the surface, a surface roughness and a haze level of the surface, and a thickness of an affected layer were measured as described later.

For example 9, the GaN substrate as a sample for measuring the Si concentration on the surface and the like was prepared by processing the GaN substrate by a technique called dry etching (DE). The dry etching for the processing was performed using a parallel plate type RIE apparatus. The processing was performed under a condition that $Cl_2$ gas and $BCl_3$ gas were used as etching gases, with a flow rate of the $Cl_2$ gas being 25 sccm (sccm: a unit of a flow rate at which one cubic centimeter of gas in a standard state flows per minute; hereinafter the same applies) and a flow rate of the $BCl_3$ gas being 25 sccm, at a pressure of 2.66 Pa and at an RF power of 200 W.

For example 10, polishing by CMP as in example 1 was performed, and then polishing (cleaning polishing) was performed. In the polishing, a solution containing 0.3 percent by mass of citric acid and 0.1 percent by mass of TCIA was used as a polishing solution. Thereafter, the cleaning step was performed as in examples 1 to 9 to prepare the GaN substrate as a sample for measuring the Si concentration on the surface and the like.

Also for comparative examples 1 to 4, the surfaces of the GaN substrates were polished by CMP. However, for comparative example 1, a polishing solution containing abrasive grains made of SiO$_2$ and hydrochloric acid for adjusting pH was used. For comparative example 2, a polishing solution containing abrasive grains made of SiO$_2$, malic acid for adjusting pH, a surface-active agent (sodium polyacrylate), and an oxidizing agent (TCIA) was used. For comparative example 3, a polishing solution containing diamond abrasive grains, malic acid for adjusting pH, a surface-active agent (sodium polyacrylate), and an oxidizing agent (TCIA) was used. For comparative example 4, a polishing solution containing abrasive grains made of SiC, malic acid for adjusting pH, a surface-active agent (sodium polyacrylate), and an oxidizing agent (TCIA) was used. Contents of the surface-active agent and the oxidizing agent were 0.3 percent by mass and 0.1 percent by mass, respectively.

Subsequently, for comparative examples 1 to 4, the GaN substrates as samples for measuring the Si concentrations on the surface and the like were prepared by performing pure water cleaning after the polishing step as in examples 1 to 8 and 11 to 13.

It is to be noted that, from when the processing step described above was performed to when measurement described below was performed, the ambient gas within the apparatus was emitted in examples 1 to 13 and comparative examples 1, 3, and 4, whereas the ambient gas was not emitted in comparative example 2.

(Measurement of Substrate Surface)

For each of the samples (GaN substrates) of examples 1 to 13 and comparative examples 1 to 4 prepared as described above, substrate properties were measured. Specifically, the concentrations of silicon (Si) and chlorine (Cl) on the mirror-finished surface, the surface roughness and the haze level of the surface, and the thickness of an affected layer were measured. Table 1 shows results thereof.

TABLE 1

| | | Examples | | | | | | | | |
|---|---|---|---|---|---|---|---|---|---|---|
| | | 1 | 2 | 3 | 4 | 5 | 6 | 7 | 8 | 9 |
| Manufacturing Method | | CMP | CMP | CMP | CMP | CMP | CMP | CMP | CMP | DE |
| Polishing Solution | Abrasive Grains | SiO$_2$ | SiO$_2$ | SiO$_2$ | SiO$_2$ | SiO$_2$ | SiO$_2$ | SiO$_2$ | SiO$_2$ | — |
| | pH Adjustment | HCl | HCl | HCl | HCl | Malic Acid | Citric Acid | Citric Acid | Malic Acid | — |
| | Oxidizing Agent | HClO | TCIA | Na-DCIA | — | TCIA | TCIA | HClO | — | — |
| | Surface-Active Agent | ○ | ○ | ○ | ○ | ○ | ○ | ○ | ○ | — |
| Atmosphere | | emitted | emitted | emitted | emitted | emitted | emitted | emitted | emitted | emitted |
| Substrate Properties | Si Concentration (×10$^{13}$/cm$^2$) | 2.7 | 2.5 | 2.3 | 3.0 | 0.5 | 0.6 | 0.7 | 0.8 | 0.1 |
| | Cl Concentration (×10$^{13}$/cm$^2$) | 18 | 20 | 17 | 15 | 8 | 7 | 9 | ND | 12 |
| | Surface Roughness Ra (nm) | 0.45 | 0.42 | 0.41 | 0.40 | 0.30 | 0.35 | 0.37 | 0.41 | 0.83 |
| | Haze Level (ppm) | 2.3 | 2.1 | 2.0 | 2.2 | 1.4 | 1.7 | 1.8 | 2.5 | 5.0 |
| | Affected Layer | 0 | 0 | 0 | 0 | 0 | 0 | 0 | 0 | 0 |
| Processing Property | Removal Speed (μm/hr) | 1.0 | 1.2 | 1.1 | 0.6 | 1.5 | 1.3 | 1.2 | 0.9 | 5.2 |
| Epi Property | Surface Roughness Ra (nm) | 0.30 | 0.31 | 0.31 | 0.28 | 0.22 | 0.25 | 0.26 | 0.33 | 0.51 |
| Device Property | Light Emission Intensity (Relative Value) | 2.2 | 2.3 | 2.3 | 2.5 | 3.2 | 2.9 | 2.8 | 2.0 | 1 |

| | | Examples | | | | Comparative Examples | | | |
|---|---|---|---|---|---|---|---|---|---|
| | | 10 | 11 | 12 | 13 | 1 | 2 | 3 | 4 |
| Manufacturing Method | | Cleaning Polishing | CMP | CMP | CMP | CMP | CMP | CMP | CMP |
| Polishing Solution | Abrasive Grains | — | ZrO$_2$ | Cr$_2$O$_3$ | Fe$_2$O$_3$ | SiO$_2$ | SiO$_2$ | diamond | SiC |
| | pH Adjustment | Citric Acid | Malic Acid | Malic Acid | Malic Acid | HCl | Malic Acid | Malic Acid | Malic Acid |
| | Oxidizing Agent | TCIA | TCIA | TCIA | TCIA | — | TCIA | TCIA | TCIA |
| | Surface-Active Agent | — | ○ | ○ | ○ | — | ○ | ○ | ○ |
| Atmosphere | | emitted | emitted | emitted | emitted | emitted | not emitted | emitted | emitted |
| Substrate Properties | Si Concentration (×10$^{13}$/cm$^2$) | 0.2 | ND | ND | ND | 7.0 | 0.8 | ND | 0.7 |
| | Cl Concentration (×10$^{13}$/cm$^2$) | 7 | 8 | 7 | 7 | 12 | 43 | 8 | 8 |
| | Surface Roughness Ra (nm) | 0.35 | 0.68 | 0.95 | 0.56 | 0.51 | 2.3 | 3.1 | 2.6 |
| | Haze Level (ppm) | 1.7 | 3.2 | 5.0 | 2.7 | 2.8 | 12 | 16 | 8.2 |
| | Affected Layer | 0 | 30 | 50 | 0 | 0 | 0 | 300 | 150 |
| Processing Property | Removal Speed (μm/hr) | — | 2.5 | 3.2 | 1.8 | 1.0 | 1.1 | 4.8 | 4.0 |

TABLE 1-continued

| Epi Property | Surface Roughness Ra (nm) | 0.25 | 0.42 | 0.52 | 0.35 | 2.5 | 2.6 | >100 | >100 |
|---|---|---|---|---|---|---|---|---|---|
| Device Property | Light Emission Intensity (Relative Value) | 3.3 | 1.1 | 0.91 | 1.8 | — | — | — | — |

TCIA: trichloroisocyanuric acid
Na-DCIA: sodium dichloroisocyanurate
HCl: hydrochloric acid
HClO: hypochlorous acid As to the Si concentration and the Cl concentration, the number of atoms per square centimeter was inspected at a central portion of the substrate surface using a Total X-ray Reflection Fluorescence (TXRF) instrument, and Table 1 shows values thereof. The surface roughness was measured at five points on the substrate surface, and Table 1 shows an average value thereof. The haze level was measured using SURFSCAN 4500 manufactured by Tencor. The thickness of an affected layer was evaluated by observing distortion of a crystal lattice of the GaN substrate using a TEM.

As can be seen from Table 1, in examples 1 to 8 in which the polishing solutions used for CMP contained an acid such as hydrochloric acid or citric acid and a surface-active agent, the Si concentrations were significantly lower than that of comparative example 1 in which the polishing solution did not contain a surface-active agent. It can also be seen that, of examples 1 to 8, the Si concentrations were particularly reduced in examples 5 to 8 in which malic acid or citric acid was used as the acid in the polishing solutions. In examples 11 and 13 and comparative example 3 in which abrasive grains other than $SiO_2$ and SiC (abrasive grains not containing Si as an element) were used as the abrasive grains in the polishing solutions used for CMP, Si was not detected from the substrate surfaces.

Further, it can be seen that all the samples obtained with the atmosphere being emitted during treatment exhibited low values of the Cl concentration, the surface roughness, and the haze level, whereas the sample of comparative example 2 in which the atmosphere was not emitted had relatively high values of the Cl concentration, the surface roughness, and the haze level. In addition, the thicknesses of affected layers in examples 1 to 13 were all smaller than those in comparative examples 3 and 4. In particular, in examples 1 to 10 and 13 in which $SiO_2$ or $Fe_2O_3$ was used as the abrasive grains, no affected layer was detected. Although an affected layer was detected in examples 11 and 12, the thicknesses thereof were sufficiently smaller than those in comparative examples 3 and 4.

It can also be seen that, in examples 1 to 3, 5 to 7, and 11 to 13 in which the polishing solutions contained an oxidizing agent, removal speeds in the polishing step were greater than those in examples 4 and 8 in which the polishing solutions did not contain an oxidizing agent.

(Fabrication of Light Emitting Device)

For each of the samples (GaN substrates) of examples 1 to 13 and comparative examples 1 to 4 processed as described above, a plurality of epitaxially grown layers were formed on the surface thereof, and then electrode formation, separation into individual chips, mounting of the chip onto a lead frame, and the like were performed to fabricate a light emitting device (LED). The epitaxially grown layers formed on the surface of the GaN substrate specifically included a 1 μm-thick n-type GaN layer (dopant: Si) and a 150 nm-thick n-type $Al_{0.1}Ga_{0.9}N$ layer (dopant: Si) as n-type semiconductor layers, a light emission layer, and a 20 nm-thick p-type $Al_{0.2}Ga_{0.8}N$ layer (dopant: Mg) and a 150 nm-thick p-type GaN layer (dopant: Mg) as p-type semiconductor layers. The light emission layer had a multiple quantum well structure in which four barrier layers each formed of a 10 nm-thick GaN layer and three well layers each formed of a 3 nm-thick $Ga_{0.85}In_{0.15}N$ layer were stacked alternately.

As a first electrode, a layered structure including a 200 nm-thick Ti layer, a 1000 nm-thick Al layer, a 200 nm-thick Ti layer, and a 2000 nm-thick Au layer was formed on a rear surface of the substrate, and heated in a nitrogen atmosphere to form an n-side electrode with a diameter of 100 μm. As a second electrode, a layered structure including a 4 nm-thick Ni layer and a 4 nm-thick Au layer was formed on the p-type GaN layer described above, and heated in an inert gas atmosphere to form a p-side electrode. The layered body described above (i.e., the GaN substrate having the epitaxially grown layers, the n-side electrode, and the p-side electrode as described above formed thereon) was separated into chips of 400 μm per side, and thereafter the p-side electrode was bonded to a conductor with a solder layer made of AuSn. Further, the n-side electrode and the conductor were bonded with a wire, and thus a semiconductor device having a structure as a light emitting device was obtained.

(Measurement for Epitaxially Grown Layers)

Surface roughnesses of the epitaxially grown layers formed on the surfaces of the GaN substrates of examples 1 to 13 and comparative examples 1 to 4 prepared as described above were measured by the same technique as that used for measuring the surface roughnesses of the GaN substrates described above. Table 1 also shows results thereof. As can be seen from Table 1, the surface roughnesses of the epitaxially grown layers in examples 1 to 13 were smaller than those in comparative examples 1 to 4.

The Si concentration at an interface between the substrate and the epitaxial layer was measured by SIMS. The Si concentrations in examples 1, 5, 10, and 13, and comparative example 1 were $1 \times 10^{20}/cm^3$, $1 \times 10^{19}/cm^3$, $1 \times 10^{18}/cm^3$, $1 \times 10^{17}/cm^3$, and $5 \times 10^{20}/cm^3$, respectively. The silicon concentrations at the interfaces in examples 1, 5, 10, and 13 were smaller than that in comparative example 1.

(Measurement of Light Emission Intensity)

Light emission intensities of the light emitting devices of examples 1 to 13 and comparative examples 1 to 4 prepared as described above were measured. Table 1 also shows results thereof. As can be seen from Table 1, light emission did not occur in the light emitting devices of comparative examples 1 to 4, whereas light emission in the light emission layer of the epitaxially grown layers was confirmed in the light emitting devices of examples 1 to 13. To measure a light emission intensity, a light emitting device as each sample was mounted within an integrating sphere, a prescribed current (20 mA) was applied to the light emitting device, emitted light was collected at a detector, and a light output value output from the detector was measured.

Although the embodiments and the examples of the present invention have been described, the embodiments and the examples of the present invention disclosed above are by way of illustration only, and the scope of the present invention is not limited to these embodiments of the present invention. The scope of the present invention is defined by the scope of the claims, and is intended to include any modifications within the scope and meaning equivalent to the scope of the claims.

INDUSTRIAL APPLICABILITY

The present invention is particularly advantageously applicable to a group III nitride substrate used for a light emitting device, a power device, and the like, an epitaxial layer-provided substrate using the group III nitride substrate, and methods of manufacturing the same.

The invention claimed is:

1. A method of manufacturing a group III nitride substrate, comprising:
    a polishing step of polishing a surface of the group III nitride substrate; and
    a cleaning step of cleaning the surface of said group III nitride substrate after said polishing step,
    wherein an ambient gas in contact with said group III nitride substrate is controlled during said polishing step and after said cleaning step to maintain a number of chlorine atoms per square centimeter of said surface of said group III nitride substrate after said cleaning step to be not more than $2\times10^{14}$,
    the surface of said group III nitride substrate is polished in said polishing step by chemical mechanical polishing such that a surface roughness Ra of said surface of said group III nitride substrate is not more than 1 nm, and
    a polishing solution used in said chemical mechanical polishing contains a surface-active agent and an acid.

2. The method of manufacturing a group III nitride substrate according to claim 1, wherein said polishing solution further contains an oxidizing agent.

3. The method of manufacturing a group III nitride substrate according to claim 1, wherein the acid contained in said polishing solution is an organic acid.

4. The method of manufacturing a group III nitride substrate according to claim 3, wherein said organic acid is a carboxylic acid.

5. The method of manufacturing a group III nitride substrate according to claim 1, further comprising, after said polishing step and before said cleaning step, a step of polishing the surface of said group III nitride substrate using an acid solution or an alkaline solution.

6. A method of manufacturing an epitaxial layer-provided substrate, comprising:
    a substrate preparation step of performing the method of manufacturing a group III nitride substrate according to claim 1; and
    a step of forming an epitaxially grown layer on a surface of said group III nitride substrate obtained by said substrate preparation step.

7. A method of manufacturing a semiconductor device, comprising:
    an epitaxial layer-provided substrate preparation step of performing the method of manufacturing an epitaxial layer-provided substrate according to claim 6; and
    a step of forming the semiconductor device by performing an electrode formation step and a processing step on the epitaxial layer-provided substrate obtained by said epitaxial layer-provided substrate preparation step.

* * * * *